United States Patent
Lin

(10) Patent No.: US 7,045,391 B2
(45) Date of Patent: May 16, 2006

(54) MULTI-CHIPS BUMPLESS ASSEMBLY PACKAGE AND MANUFACTURING METHOD THEREOF

(75) Inventor: Chian-Chi Lin, Tainan (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/920,383

(22) Filed: Aug. 18, 2004

(65) Prior Publication Data

US 2005/0121765 A1 Jun. 9, 2005

(30) Foreign Application Priority Data

Dec. 9, 2003 (TW) .............................. 92134747 A

(51) Int. Cl.
*H01L 21/44* (2006.01)

(52) U.S. Cl. ...................................................... 438/109

(58) Field of Classification Search ................. 438/109
See application file for complete search history.

(56) References Cited

U.S. PATENT DOCUMENTS

| | | | | |
|---|---|---|---|---|
| 5,353,498 A | * | 10/1994 | Fillion et al. | 29/840 |
| 5,399,898 A | | 3/1995 | Rostoker | |
| 5,489,554 A | * | 2/1996 | Gates | 438/59 |
| 6,294,741 B1 | * | 9/2001 | Cole et al. | 174/260 |
| 6,355,501 B1 | * | 3/2002 | Fung et al. | 438/107 |
| 6,383,837 B1 | * | 5/2002 | Tsunashima | 438/106 |
| 6,607,938 B1 | * | 8/2003 | Kwon et al. | 438/109 |
| 2003/0017647 A1 | * | 1/2003 | Kwon et al. | 438/109 |
| 2003/0107119 A1 | * | 6/2003 | Kim | 257/686 |

* cited by examiner

*Primary Examiner*—Matthew Smith
*Assistant Examiner*—Lex H. Malsawma
(74) *Attorney, Agent, or Firm*—Bacon & Thomas, PLLC

(57) ABSTRACT

A multi-chips bumpless assembly package with a patterned conductive layer, a patterned dielectric layer and an insulation layer interposed between the chips is provided, which can shorten the distance of the electrical connection between the chips so as to upgrade the electrical performance of the assembly package and make the package thinner and thinner. Moreover, a manufacturing method thereof is also provided to form a package with high electrical performance.

16 Claims, 4 Drawing Sheets

MULTI-CHIPS BUMPLESS ASSEMBLY PACKAGE AND MANUFACTURING METHOD THEREOF

BACKGROUND OF THE INVENTION

1. Field of Invention

This invention relates to a semiconductor assembly package. More particularly, the present invention is related to a multi-chips bumpless assembly package and a manufacturing method thereof.

2. Related Art

Integrated circuits (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits.

Originally, the electrical connections between the chips comprise wire bonding connection and flip chip connection. In wire bonding connection, a wire bonder is disposed above the first chip and then the tip of the conductive wire is melting to shape into a ball. Next, the conductive wire is bonded onto the bonding pad of the first chip. Then, the wire bonder is moved and disposed above the corresponding bonding pad of the second chip, and then the conductive wire will be bonded onto the corresponding bonding pad of the second chip to complete wire bonding the first chip and the second chip. In flip chip bonding, a plurality of bumps are formed on the bonding pads of the chip, and then flipped and bonded to another chip by a reflow process.

However, as shown above, in the wire-bonding package, when the chips are stacked with each other to form a stacked package, the wires connecting the upper chip and the substrate are longer. In such a manner, said wires are easily to be damaged due to the molding flow attacking the wires. In addition, when the flip chip are stacked with each to form a stacked package, there are usually needed to form a redistributed layers on the back side of the chips and utilizing another wires for electrically connecting the chips to the substrate. Thus, the process will become more complex. Besides, as shown in FIG. 1A, it illustrates a multi-chips stacked package patented in U.S. Pat. No. 5,399,898 to Michael D. Rostoker et al. entitled "Multi-Chip Semiconductor Arrangements Using Flip Chip Dies" and each of said chips 30 has bumps 20A and 20B formed on the double sides; and the bumps 20B on the upper side are utilized to connect to an external devices, such as the same chip 30 as shown in FIG. 1B, placed over the chip 30 and the bumps 20A on the lower side are utilized to connect to an external device, such as the contact 10 of the substrate as shown in FIG. 1B, disposed under the chip 30. To be noted, the bumps 20A and 20B are electrically connected to each other through the electrical traces formed inside the chip 30. However, the manufacturing method of such chip is more complex than conventional one. Besides, it is more difficult to control the collapse of the bumps 20A and 20B, when such chip is interposed between electronic devices, due to the bumps 20A and 20B formed on the double sides.

Therefore, providing another semiconductor assembly package to solve the mentioned-above disadvantages is the most important task in this invention.

SUMMARY OF THE INVENTION

In view of the above-mentioned problems, this invention is to provide a multi-chips bumpless assembly package with a conductive layer and a dielectric layer interposed between the chips, which can shorten the distance of the electrical connection between the chips so as to upgrade the electrical performance of said assembly package and make the package thinner and thinner.

To achieve the above-mentioned, a multi-chips bumpless assembly package is provided, wherein the package comprises a first chip, a first encapsulation encompassing the first chip, a patterned first dielectric layer formed over the first chip and the first encapsulation, a patterned first conductive layer formed over the patterned first dielectric layer, an insulation layer formed over the patterned first dielectric layer, a second chip disposed over the insulation layer, a second encapsulation encompassing the second chip, a through hole penetrating the insulation layer and the second encapsulation and exposing the patterned first conductive layer, a conductive material filling in the through hole, a conductive trace disposing on the second chip and the second encapsulation and connecting the conductive material and the second bonding pads, a patterned second dielectric layer formed over the second chip, the second encapsulation and the conductive trace, a patterned second conductive layer formed over the patterned second dielectric layer, a patterned third dielectric with vias layer formed over the patterned second conductive layer and the patterned second dielectric layer, and a plurality of bumps formed in the vias and electrically connected to the patterned second conductive layer. Furthermore, therein, the first chip and the second chip are electrically connected with each other through the patterned first conductive layer, the conductive trace, the conductive material and the patterned second conductive layer.

In addition, a manufacturing method of said package is provided to achieve the mentioned objective. The method mainly comprises the following steps. First, a first chip with a first encapsulation encompassed is provided, wherein first bonding pads of the first chip is exposed out of the encapsulation. Second, a patterned first dielectric layer is provided over the first chip and the first encapsulation except the first bonding pads so as to leave the bonding pads exposed through a plurality of first vias of the patterned first dielectric layer. Next, a patterned first conductive layer is provided over the patterned first dielectric layer and connected to the first bonding pads through the first vias. Then, an insulation layer is placed over the patterned first conductive layer. Afterwards, a second chip and a second encapsulation are disposed on the insulation layer and said second encapsulation encompasses the second chip. Next, a plurality of through holes penetrating the second encapsulation and the first insulation are formed and expose portions of the patterned first conductive layer. Then, a conductive material, such as conductive epoxy and plated conductive metal, is filled in the through holes and a conductive trace is disposed on the second chip and the second encapsulation and connects the conductive material and the second bonding pads. Next, a patterned second dielectric layer is provided over the second chip, the conductive trace and the second encapsulation except the second bonding pads so as to leave the second bonding pads exposed through a plurality of second vias of the patterned second dielectric layer. Then, a patterned second conductive layer is formed over the patterned second dielectric layer and electrically connects the second bonding pads through a second vias of the patterned second dielectric layer. Afterwards, a patterned third dielectric layer with a plurality of third vias is formed over the patented second conductive layer and the patterned second dielectric layer. Finally, a plurality of bumps are formed in the third vias and connect to the patented second conductive layer so as to electrically connect to the second bonding pads.

According to this invention, the chips are electrically connected to each other through the patterned first conductive layer, the conductive material, and the conductive trace; and the chips are electrically connected to external electronic devices through the bumps and the patterned second conductive layer. Namely, the patterned first conductive layer, the conductive material, and the conductive trace serve as the electrical connections between the chips and the patterned second conductive layer and the bumps are taken as the electrical connection between the chips and external electronic devices. In such a manner, the distance of the electrical connection between the chips and the external devices is short. Thus, the characterization impedance can be lowered to prevent the signal from being attenuated. Furthermore, this invention can prevent the parasitics of the inductance and the capacitor from being induced so as to be suitable to the assembly package designed for performing high-circuits. Moreover, it makes the thickness of the package thinner and thinner.

BRIEF DESCRIPTION OF THE DRAWINGS

The invention will become more fully understood from the detailed description given herein below illustrations only, and thus are not limitative of the present invention, and wherein:

FIG. 2G is a cross-sectional view of a multi-chips bumpless assembly package according to the first embodiment of the present invention;

DETAILED DESCRIPTION OF THE INVENTION

The multi-chips bumpless assembly package according to the preferred embodiments of this invention will be described herein below with reference to the accompanying drawings, wherein the same reference numbers refer to the same elements.

FIGS. 2A to 2G are partially enlarged cross-sectional views showing the progression of steps for forming a multi-chips bumpless assembly package according to the first preferred embodiment of this invention.

Figure 1A:
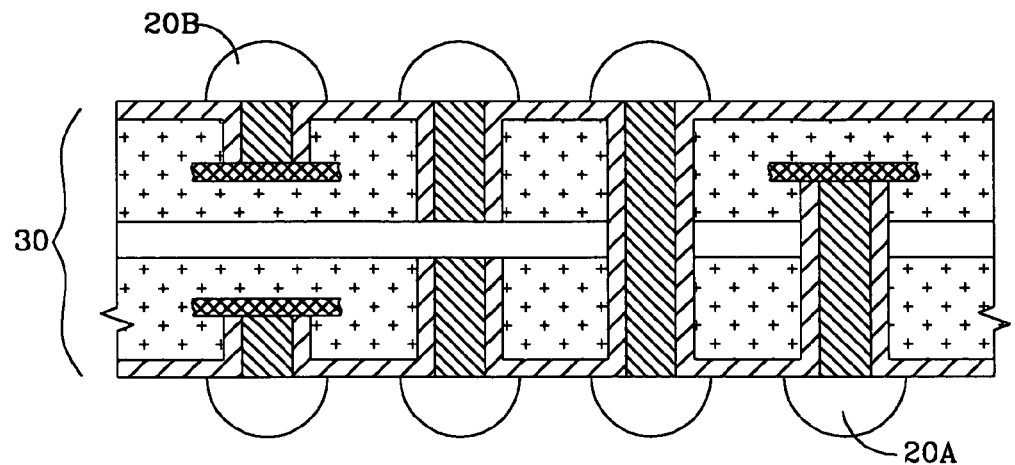
FIG. 1A is a cross-sectional view of a conventional chip having double-sided bumps formed thereon.
Figure 1B:
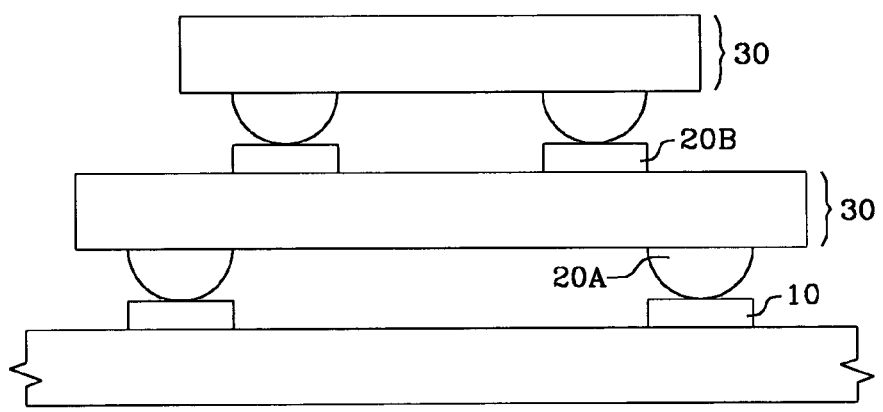
FIG. 1B is a cross-sectional view of a conventional flip-chip package with the chip of FIG 1A.
Figure 2A:
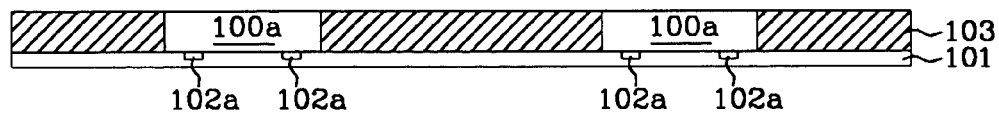
FIGS. 2A to 2G are partially enlarged cross-sectional views showing the progression of steps for forming a multi-chips bumpless assembly package according to the first embodiment of the present invention.

As shown in FIG. 2A, a plurality of first chips 100a with a plurality of first bonding pads 102a formed on a first active surfaces are placed on a first protection film 101 through attaching the first bonding pads 102a to the film 101. Therein, the first chips 100a are separated from each other to form a plurality of first gaps. Next, a first encapsulation 103 is provided to be filled in the first gaps so as to encompass the first chips 100a. To be noted, the first encapsulation 103 can be made of dielectric materials. Then, optionally, a grinding process is performed to have the first back surfaces of the chips 100a exposed out of the encapsulation 103 and make said first back surfaces of the chips 100a more flat to ensure the reliability of forming conductive layers between the first chips 100a and the other chips.

Figure 2B:
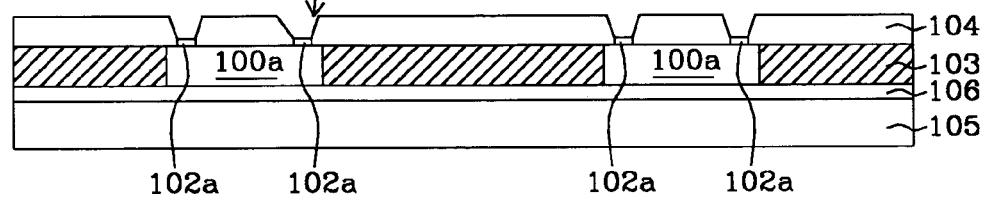

Next, the first chips 100a with the first encapsulation 103 encompassed are flipped over and placed on a carrier 105, and then the first protective film 101 is removed to have the first bonding pads 102a exposed to the outside. Then, a first dielectric layer is formed over the first chips 100a and the first encapsulation 103, and a photo-lithography process and an etching process are performed through disposing a photo-resist layer, serving as a mask, on the first dielectric layer to remove a portion of the first dielectric layer 104 to form a plurality of first vias 104a exposing the first bonding pads 102a so as to form a patterned first dielectric layer 104, and finally the photo-resist layer is removed as shown in FIG. 2B. In addition, the carrier 105 may be a metal plate 105, serving as a heat spreader, wherein the carrier 105 is provided to place below the first back surfaces of the first chips 100a, and is attached to the first chips 100a and the first encapsulation 103 through an adhesive 106.

Figure 2C:
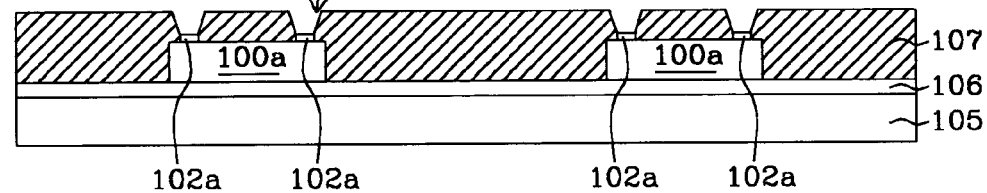

Moreover, as shown above, the first encapsulation 103 can be placed on the metal plate 105 before the first chips 100 are placed over the metal plate 105. Namely, after a metal plate 105 is provided, the first encapsulation 103 is disposed on the metal plate 105 with a plurality of spaces therebetwen for accommodating the first chips 100. Afterwards, the first chips 100 are placed in the spaces, and then a first dielectric layer is disposed on the first chips 100 and the first encapsulation 103. And then the same steps are performed as shown above to form the patterned first dielectric layer 104 with a plurality of vias 104a therein. In addition, the first encapsulation can be made of a photosensitive material. In such a manner, when the photosensitive material is disposed to cover the first chips 100, and then a photo-lithography process is performed to form first vias 107a in the first encapsulation, which expose the first bonding pads 102a as shown in FIG. 2C. Thus, it is unnecessary to form additional photo-resist layer to remove the portions of the first encapsulation to form the first vias 107a to expose the first bonding pads 102a.

Figure 2D:
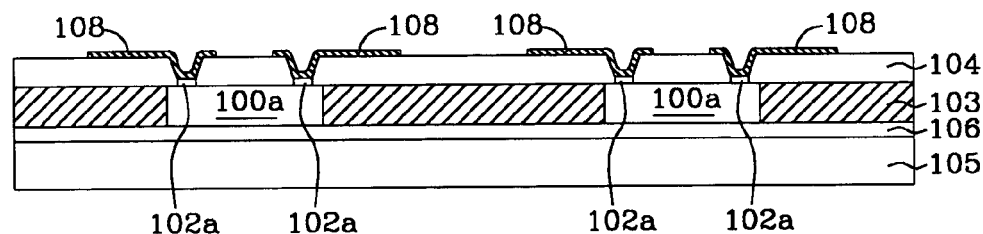

Moreover, as shown in FIG. 2D and referring to FIG. 2B again, a patterned first conductive layer 108 is formed on the first patterned dielectric layer 104 and the first bonding pads 102a through the first vias 104a. Said patterned first conductive 108 is formed according to the following steps. Firstly, a conductive layer, such as a metal layer, is formed on the patterned first dielectric layer, no matter said made of the photo-sensitive material as shown in FIG. 2C or the dielectric material as shown in FIG. 2B, and the first bonding pads 102a. Then, a lithography process and an etching process are performed to remove a portion of the first conductive layer to form the patterned first conductive layer 108.

Figure 2E:
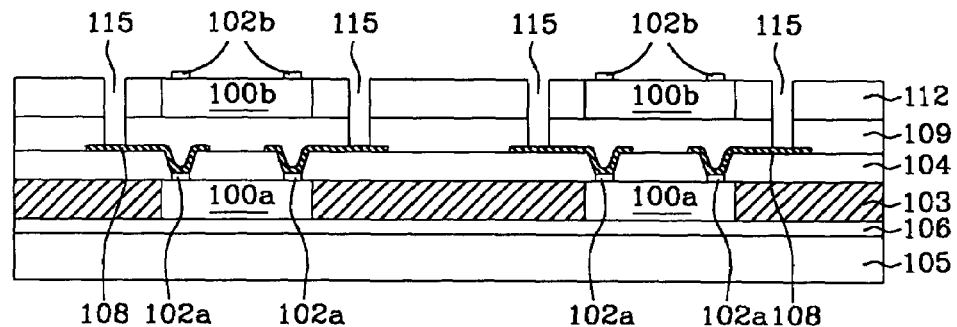

Next, referring to FIG. 2E, before a plurality of second chips 100b are provided above the patterned first conductive layer 108, there is an insulation layer 109 formed above the first chips 100a and over the patterned conductive layer 108 and the patterned first dielectric layer 104. After the second chips 100b are placed on the insulation layer 109, a second encapsulation 112 is formed between the second chips 100b so as to have the second encapsulation 112 encompassing the second chips 100b. Therein, the second encapsulation 112 can be made of a photo-sensitive material or a dielectric material. Then, the typical photolithography process and the etching process are performed to form a plurality of through holes 115, penetrating the insulation layer 109 and the second encapsulation 112, exposing the patterned first conductive layer 108.

Figure 2F:
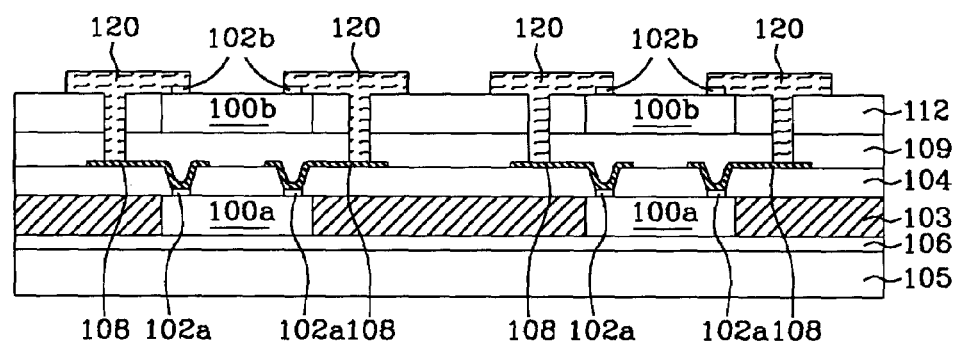
Figure 2G:
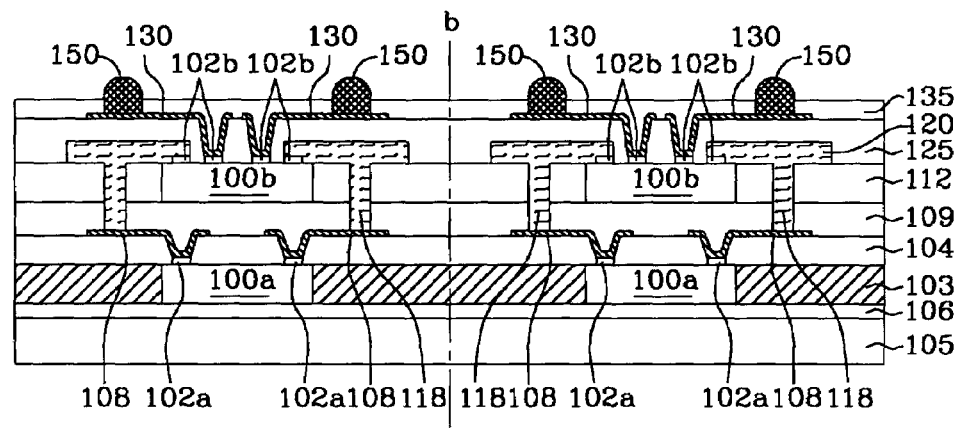

Then, as shown in FIG. 2F, a conductive material 118, such as conductive epoxy and plated conductive metal, is filled in the through holes 115 and a conductive trace 120 is disposed on the second chip 100b and the second encapsulation 112 and connects the conductive material 118 and the second bonding pads 102b. Next, as shown in FIG. 2G, a patterned second dielectric layer 125 is provided over the second chip 100b and the second encapsulation 112 except portions of the second bonding pads 102b so as to leave the portions of the second bonding pads 102b exposed through a plurality of second vias 125a of the patterned second dielectric layer 120. Then, a patterned second conductive layer 130 is formed over the patterned second dielectric layer 125 and electrically connects the portions of the second bonding pads 102b through a second vias 125a of the patterned second dielectric layer 125.

Afterwards, referring to FIG. 2G again, a patterned third dielectric layer 135 with a plurality of third vias 135a is formed over the patented second conductive layer 130. Finally, a plurality of bumps 150 are formed in the third vias 135a so as to electrically connect to the second bonding pads 102b and to serve as external terminals for connecting to external electronic devices. In addition, the bumps 150 are formed by solder ball placing, screen printing solder pastes and plating solder materials, and reflowing such solder bumps to secure to the patterned second conductive layer 130. To be noted, FIG. 2G illustrates the multi-chips bumpless assembly package according to the first embodiment.

Figure 2H:
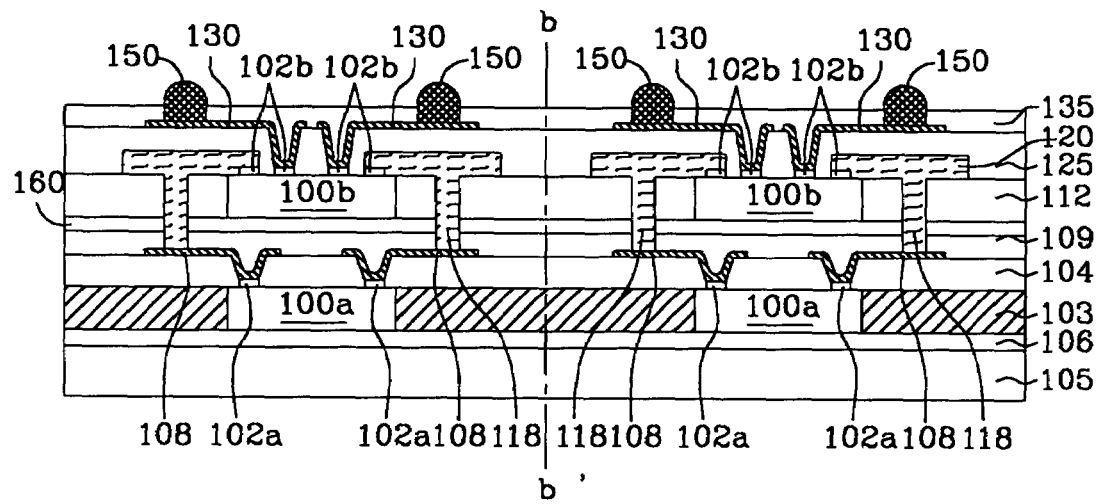
FIG. 2H is a cross-sectional view of a multi-chips bumpless assembly package according to the second embodiment of the present invention.

Furthermore, the second chips 100b and the second encapsulation 112 can be made in advance. Namely, after the insulation layer 109 is formed above the first chips 100a, there are provided the second chips 100b with the second encapsulation 112 encompassing the second chips 100b to mount onto the insulation layer 109 through an adhesive 160 as shown in FIG. 2H which is the difference of this second embodiment from the first embodiment as shown above.

Figure 2I:
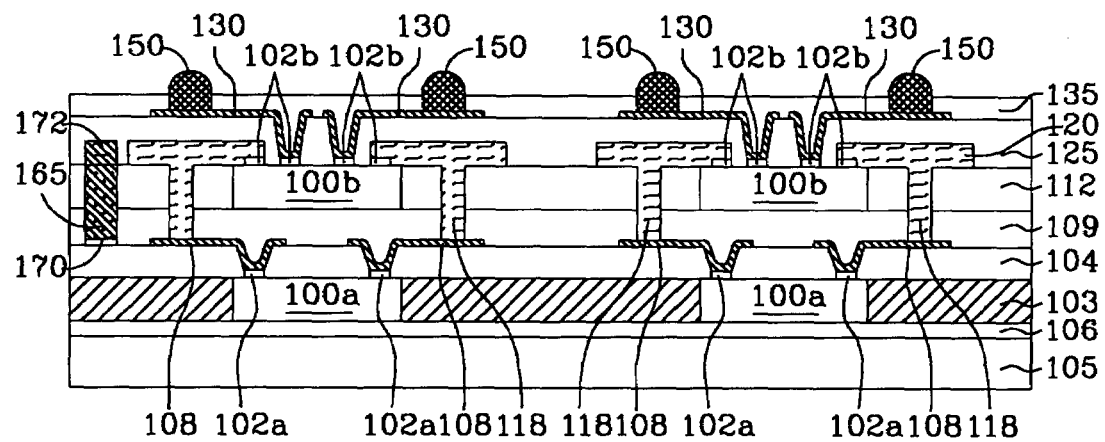
FIG. 2I is a cross-sectional view of a multi-chips bumpless assembly package according to the third embodiment of the present invention.

In addition, referring to FIG. 2I, which illustrates the multi-chips bumpless assembly package according to the third embodiment. Therein, there is further formed another metal layer 170, serving as a bottom plate, on the patterned first dielectric layer 104. And a dielectric material 165 is provided and disposed on the metal layer 170 and then another metal layer 172, serving as a top plate, is formed on the top of the dielectric material 165. In other words, the bottom plate, the dielectric material and the top plate form an embedded passive component in the package, and this is the difference of the third embodiment from the first embodiment as shown above.

Although the invention has been described in considerable detail with reference to certain preferred embodiments, it will be appreciated and understood that various changes and modifications may be made without departing from the spirit and scope of the invention as defined in the appended claims.

What is claimed is:

1. A manufacturing method of a multi-chips bumpless assembly package, comprising:
   providing a plurality of first chips with a first encapsulation encompassed, wherein the first chips have first bonding pads and the first bonding pads are exposed out of the first encapsulation;
   providing a patterned first dielectric layer with a plurality of first vias over the first chips and the first encapsulation, wherein the first bonding pads are exposed out of the patterned first dielectric layer through the first vias;
   providing a patterned first conductive layer located over the patterned first dielectric layer and connected to the first bonding pads through the first vias;
   providing an insulation layer located over the patterned first conductive layer and the patterned first dielectric layer;
   providing a plurality of second chips with a second encapsulation encompassed to be disposed on the insulation layer, wherein the second chips have second bonding pads and the second bonding pads are exposed out of the second encapsulation;
   forming a plurality of through holes, wherein the through holes penetrate the second encapsulation and the insulation layer and expose portions of the patterned first conductive layer;
   providing a conductive material filled in the through holes;
   disposing a conductive trace on the second chips and the second encapsulation, wherein the conductive trace connects the conductive material and one of the second bonding pads;
   providing a patterned second dielectric layer with a plurality of second vias over the second chips, the second encapsulation and the conductive trace, wherein portions of the second bonding pads are exposed out of the patterned second dielectric layer through the second vias;
   providing a patterned second conductive layer located above the second chips, the second encapsulation and the patterned second dielectric layer, wherein the patterned second conductive layer connects to the portions of the second bonding pads;
   providing a patterned third dielectric layer with a plurality of third vias over the patterned second conductive layer and the patterned second dielectric layer, wherein portions of the patterned second patterned conductive layer are exposed out of the patterned third dielectric layer through the third vias; and
   forming a plurality of bumps in the third vias, wherein the bumps are connected to the patterned second conductive layer.

2. The manufacturing method of claim 1, further comprising a heat spreader attached to first lower surfaces of the first chips.

3. The manufacturing method of claim 1, wherein the step of providing the first chips with the first encapsulation encompassed further comprising:
   providing the first chips disposed on a carrier, wherein the first bonding pads are faced upwardly and the first chips are arranged separately to form gaps;
   providing the first encapsulation covering the first chips and filling in the gaps; and
   removing the first encapsulation to leave the first bonding pads exposed.

4. The manufacturing method of claim 3, wherein the first encapsulation is made of a photosensitive material.

5. The manufacturing method of claim 4, wherein the step of removing the first encapsulation is performed by a photolithography process.

6. The manufacturing method of claim 1, wherein the step of filling the conductive material in the through holes is performed by the method of electroless plating.

7. The manufacturing method of claim 1, wherein the step of filling the conductive material in the through holes is performed by the method of screen-printing.

8. The manufacturing method of claim 1, wherein the step of disposing the conductive trace on the second chip and the second encapsulation is performed by the method of electroless plating.

9. The manufacturing method of claim 1, further comprising a bottom plate disposed over the patterned first dielectric layer.

10. The manufacturing method of claim 9, further comprising a dielectric material disposed on the bottom plate.

11. The manufacturing method of claim 10, further comprises a top plate disposed on the dielectric material over the bottom plate.

12. The manufacturing method of claim 1, wherein the step of providing the first chips with the first encapsulation encompassed further comprising:

providing the first chips disposed on a film, wherein the first bonding pads are attached to the film and the first chips are arranged separately to form gaps;

providing the first encapsulation to cover the first chips, the gaps and the films;

removing the first encapsulation not covered by the film to leave first back surfaces of the first chips exposed; and removing the film.

13. The manufacturing method of claim 1, further comprising reflowing the bumps.

14. The manufacturing method of claim 1, further comprising performing a singulating process to form a plurality of multi-chips bumpless assembly package, wherein the multi-chips bumpless assembly package at least comprises one first chip, and one second chip disposed above the first chip.

15. The manufacturing method of claim 1, wherein the step of forming the through hole is performed by performing a laser penetrating the second encapsulation and the insulation layer.

16. The manufacturing method of claim 1, wherein the step of forming the through hole is performed by an etching process to penetrate the second encapsulation and the insulation layer.

* * * * *